United States Patent
Iyer et al.

(10) Patent No.: US 6,667,540 B2
(45) Date of Patent: *Dec. 23, 2003

(54) METHOD AND APPARATUS FOR REDUCING FIXED CHARGE IN SEMICONDUCTOR DEVICE LAYERS

(75) Inventors: Ravi Iyer, Boise, ID (US); Randhir P. S. Thakur, Boise, ID (US); Howard E. Rhodes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/228,697

(22) Filed: Aug. 26, 2002

(65) Prior Publication Data

US 2002/0190384 A1 Dec. 19, 2002

Related U.S. Application Data

(63) Continuation of application No. 09/145,723, filed on Sep. 2, 1998, now Pat. No. 6,441,466, which is a division of application No. 08/972,288, filed on Nov. 18, 1997, now Pat. No. 5,933,760, which is a continuation of application No. 08/594,652, filed on Feb. 2, 1996, now abandoned.

(51) Int. Cl.[7] .............................................. H01L 23/58
(52) U.S. Cl. .................. 257/634; 257/632; 257/650
(58) Field of Search ................................ 257/632, 634, 257/650

(56) References Cited

U.S. PATENT DOCUMENTS

| | | | |
|---|---|---|---|
| 4,872,947 A | 10/1989 | Wang et al. | 156/643 |
| 4,892,753 A | 1/1990 | Wang et al. | 427/38 |
| 4,960,488 A | 10/1990 | Law et al. | 156/643 |
| 5,000,113 A | 3/1991 | Wang et al. | 118/723 |
| 5,104,482 A | 4/1992 | Monkowski et al. | 156/643 |
| 5,231,058 A | 7/1993 | Maeda et al. | 438/784 |
| 5,344,797 A | 9/1994 | Pai et al. | 437/238 |
| 5,354,715 A | 10/1994 | Wang et al. | 437/238 |
| 5,362,526 A | 11/1994 | Wang et al. | 427/573 |
| 5,382,550 A | 1/1995 | Iyer | 437/235 |
| 5,409,858 A | 4/1995 | Thakur et al. | 437/173 |
| 5,445,699 A | 8/1995 | Kamikawa et al. | 156/345 |
| 5,474,955 A | 12/1995 | Thakur | 437/173 |
| 5,486,267 A | 1/1996 | Knight et al. | 156/659.11 |
| 5,506,443 A | 4/1996 | Furumura et al. | 257/635 |
| 5,523,597 A | 6/1996 | Baumann et al. | 257/297 |

(List continued on next page.)

FOREIGN PATENT DOCUMENTS

| | | | |
|---|---|---|---|
| EP | 0272140 | 6/1988 | |
| EP | 0497541 | 8/1992 | H01L/21/316 |
| JP | 07-273182 | 10/1995 | H01L/21/76 |
| JP | 4-7-326750 | * 12/1995 | H01L/29/78 |

OTHER PUBLICATIONS

Fry, H..W. ,et al. ,"Applications of APCVD TEOS/O3 thin films in ULSI IC fabrication", *Solid State Technology*, 37, No. 3,(Mar. 1994),pp. 31–40.

Fujino, K..,et al. ,"Doped Silicon Oxide Deposition by Atmospheric Pressure and Low Temperature Chemical Vapor Deposition Using Tetraethoxysilane and Ozone", *Journal of the Electrochemical Society*, 138, No. 10,(Oct. 1991),pp. 3019–3024.

(List continued on next page.)

*Primary Examiner*—George Eckert
(74) *Attorney, Agent, or Firm*—Schwegman, Lundberg, Woessner & Kluth, P.A.

(57) ABSTRACT

The fixed charge in a borophosphosilicate glass insulating film deposited on a semiconductor device is reduced by reacting an organic precursor such as TEOS with $O_3$. When done at temperatures higher than approximately 480 degrees C., the carbon level in the resulting film appears to be reduced, resulting in a higher threshold voltage for field transistor devices.

33 Claims, 3 Drawing Sheets

U.S. PATENT DOCUMENTS

| | | | | |
|---|---|---|---|---|
| 5,552,342 | A | 9/1996 | Itou et al. | 437/195 |
| 5,576,247 | A | 11/1996 | Yano et al. | 437/225 |
| 5,631,174 | A | 5/1997 | Iyer | 438/760 |
| 5,716,891 | A | 2/1998 | Kodama | 438/783 |
| 5,789,313 | A | 8/1998 | Lee | 438/599 |
| 5,906,861 | A | 5/1999 | Mack et al. | 427/255.3 |
| 6,462,394 | B1 * | 10/2002 | Thakur et al. | 257/506 |

OTHER PUBLICATIONS

Fujino, K..,et al. ,"Reaction Mechanism of TEOS and O3 Atmospheric Pressure CVD", *1991 VMIC Conference*, (Jun. 11–12, 1991),445–447.

Kim, S..B. ,et al. ,"Mechanism for the N–field Device Failure in Double Level Metal CMOS Device", *IEEE IRPS*, (1994),309–315.

Kuo, H..H. ,et al. ,"Intermetal Dielectric–Induced N–Field Device Failure in Double–Level–Metal CMOS Process", *IEEE Electron Device Letters, 13*, (Aug., 1992),405–407.

Lee, P..,et al. ,"Sub–atmospheric Chemical Vapor Deposition (SACVD) of TEOS–Ozone USG and BPSG", *1990 VMIC Conference*, (Jun. 12–13, 1990),396–398.

Liu, L..M. ,et al. ,"Back–end Induced IMO Layer Charging", *1991 VMIC Conference*, (Jun. 11–12, 1991),451–453.

Maeda, Kazuo.,et al. ,"CVD TEOS/O3: Development history and applications", *Solid State Technology*, 36, No. 6,(Jun. 1993),pp. 83–88.

Nishimoto, Y..,et al. ,"Dielectric Film Desposition by Atmospheric Pressure and Low Temperature CVD Using TEOS, Ozone and New Organometallic Doping Sources", *1989 VMIC Conference*, (Jun. 12–13, 1989),382–389.

Pramanik, D..,et al. ,"Field Inversion in CMOS Double Metal Circuits Due to Carbon Based SOGS", *1989 VMIC Conference*, (Jun. 12–13, 1989),454–462.

Ruska, W..S. , In: *Microelectronic Processing—An Introduction to the Manufacturing of Integrated Circuits*, McGraw–Hill Book Company, New York,(1987),p. 92.

* cited by examiner

METHOD AND APPARATUS FOR REDUCING FIXED CHARGE IN SEMICONDUCTOR DEVICE LAYERS

This application is a Continuation of U.S. application Ser. No. 09/145,723, filed Sep. 2, 1998, now U.S. Pat. No. 6,441,466 which is a Divisional of U.S. application Ser. No. 08/972,288, filed Nov. 18, 1997, now U.S. Pat. No. 5,933,760, which is a File-Wrapper Continuation of U.S. application Ser. No. 08/594,652, filed Feb. 2, 1996, now abandoned.

FIELD OF THE INVENTION

The present invention relates to methods and apparatus for manufacturing semiconductor devices, and in particular to reducing the fixed charge in insulative layers on such devices.

BACKGROUND OF THE INVENTION

Field effect transistors (FETs) are formed on silicon, or similar semiconductor substrates. A field effect transistor is usually formed with active areas such as two heavily doped, spaced apart regions of silicon, which are called a source and a drain. A gate structure is formed between the source and the drain, and operates to control the amount of electrical current which flows between them. When appropriate voltage is applied to the gate, an electrically conductive channel is formed under the gate, allowing current flow between the source and the drain. Active areas of adjacent transistors may be isolated from each other by the formation of a field oxide layer which acts as an insulator.

Part of the process of forming transistors involves the application of various layers of material. One such layer is utilized as an insulating layer between the gate and metal interconnects. Silane based layers have been used in the past, but do not fill tight spaces very well. Tetraethyloxysilicate (TEOS) based borophosphosilicate glass (BPSG) film layers using TEOS is a silicon containing source gas which has also been used. Doping TEOS with boron and phosphorus through the addition of triethylborane (TEB) and triethylphosphate (TEPO) respectively, increases the film's ability to reflow and fill in tight spaces. Such BPSG layers, however, have been plagued with unacceptable fixed electrical charge, thus being unsuitable for use in semiconductor devices. This is characteristic of both plasma and non-plasma TEOS based BPSG deposition. However, due to the material's superior abilities to reflow at low temperatures and getter mobile species, it is highly desirable to adapt this material for use in semiconductor devices, particularly those employing certain silicide technologies which require lower temperatures to avoid agglomeration, such as those using titanium silicide.

Such layers are used as insulators between conductive layers. Excess fixed charge has an undesirable effect on adjacent layers. Excessive fixed charge for example can cause the silicon surface to invert under the field oxide, resulting in an undesirable channel for current to flow between two active areas that are isolated by the field oxide. This channel has a charge opposite to that of the substrate, which is also depleted of charge carriers in the region surrounding the inversion region. Thus, the excessive fixed charge creates or quickens the formation of the channel through which current flows, at undesired times. Excessive fixed charge also causes threshold voltage degradation in field transistors, causing premature and excessive leakage, in both n-type and p-type channel devices. The threshold voltage is the minimum voltage that must be applied for a current to flow in the channel between active regions. In semiconductor field transistor devices, it is paramount that the threshold voltage be maintained above a certain level to reduce leakage current between active regions.

There is a need to bring this fixed charge down to levels that do not induce a channel to form between active regions of field transistors formed in semiconductor substrates. There is also a need to provide an insulative layer having good reflow capabilities at low temperatures and which exhibit a low fixed charge.

SUMMARY OF THE INVENTION

An insulative film layer such as borophosphosilicate glass (BPSG) is deposited on a semiconductor device by reacting Tetraethyloxysilicate (TEOS) with ozone ($O_3$). $O_3$ is formed in a corona discharge tube by flowing $O_2$ such that the $O_3$ concentration in $O_2$ is between approximately 2–20% by weight. Triethylphosphate (TEPO) and triethylborane (TEB) are organometallics used to dope the film with phosphorous and boron respectively. The BPSG is deposited at pressures of approximately 10 Torr to 760 Torr or atmospheric pressure. The temperature of the BPSG layer is higher than approximately 480 degrees C. This provides a low fixed charge film of BPSG which reflows well at low temperatures. The low fixed charge raises the threshold voltage which in turn helps prevent inducement of undesired channels between unassociated active areas in devices formed in the substrate.

DESCRIPTION OF THE EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense, and the scope of the present invention is defined by the appended claims.

Numbering in the Figures is usually done with the hundreds and thousands digits corresponding to the figure number, with the exception that the same components may appear in multiple figures. Signals and connections may be referred to by the same number or label, and the actual meaning should be clear from the context of use.

Figure 1:
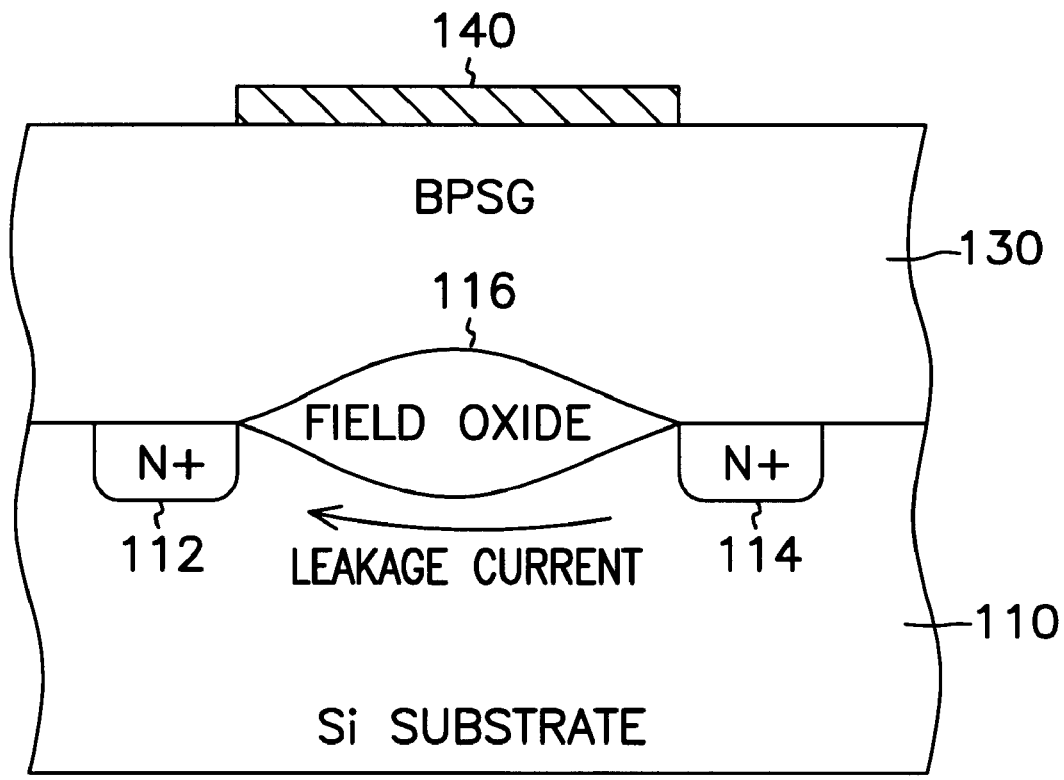
FIG. 1 is a cross section of a semiconductor device formed in accordance with the present invention.

In FIG. 1, a semiconductor device comprising a silicon substrate or other suitable semiconductor material indicated generally at 110 has many active areas such as active areas 112 and 114 of adjacent transistors formed therein separated by a field oxide indicated at 116. The field oxide 116 provides isolation between adjacent unassociated active areas of transistors. An insulative glass layer 130 such as an oxide film or borophosphosilicate glass (BPSG) is deposited over the active areas to a depth of approximately 25,000 Angstroms using an organic precursor. Metal conductors represented at 140 are then formed on top of the oxide layer 130. In a further embodiment, a second oxide layer is then formed as in inter metal dielectric, and further conductors and oxide layers are formed on top of that to form multiple levels of conductors.

In one embodiment, the glass 130 is formed to a depth of between 2K angstroms and 30K angstroms in a standard chemical vapor deposition (CVD) reactor such as the Applied Materials P5000 single wafer cold well CVD reactor by reacting tetraethyloxysilicate (TEOS) with ozone ($O_3$). $O_3$ is formed in a corona discharge tube by flowing $O_2$ at a rate of approximately 2000–8000 cubic centimeters per minute such that the $O_3$ concentration in $O_2$ is approximately 13% by weight. In further embodiments, the concentration ranges from approximate 2–20% by weight. TEOS is then pumped by liquid injectors into a flash evaporator at the rate of approximately 200–800 milligrams per minute and combined with a helium carrier gas which is provided at a rate of between approximately 2000–10,000 cubic centimeters per minute. This mixture is then combined with the oxygen mixture and introduced into the reactor through a common shower head to form the oxide layer on the substrate which is preferably heated to a temperature of at least approximately 480 degrees Celsius.

Triethylphosphate (TEPO) and Triethylborane (TEB) are organometallics used to dope the film with phosphorous and boron respectively. They are also controllably injected into the flash evaporator at rates of between 20–90 milligrams per minute and 40–300 milligrams per minute respectively to form varying percentages of doping. To form a silicon dioxide layer, neither TEPO nor TEB are added. Both are added to form a BPSG insulative oxide layer. TEPO is used alone to provide a phosphorous doped silicon dioxide layer and TEB is used alone to provide a boron doped silicon dioxide layer. The percentage of boron is varied between approximately 0.5–6%, and the percentage of phosphorous is varied between approximately 0.5–8%. Boron doping tends to lower the temperature required for reflow of the oxide layer. Phosphorous is used as a mobile ion getterer, and in combination with boron, assists in lowering the reflow temperature. Boron and phosphorous doping may also be obtained through the use of other well known organometallics.

The glass layer 130 is deposited at a pressure of approximately 200 Torr. In further embodiments, the pressure varies between approximately 10 Torr to 760 Torr or atmospheric pressure. The temperature at which the deposition of the glass layer takes place in one embodiment is approximately 510 degrees C. or higher. The heating of the substrate is provided in a known manner such as by lamp, resistive coils in the substrate chuck or infrared sources.

Following deposition of the glass layer, the substrate 110 is then transferred to a furnace for a high temperature reflow in the case of BPSG or densifying in the case of oxide. In one embodiment, a batch furnace reflow is performed at approximately 907 degrees C. for 30 minutes in a nitrogen ($N_2$) environment at approximately atmospheric pressure. Alternatively, the wafer is reflowed by a rapid thermal process (RTP) reflow at approximately 1000 degrees C. for 20 seconds, again in an $N_2$ environment at approximately atmospheric pressure. The exact times and temperatures for these reflows will vary significantly depending on the percentage concentrations of boron and phosphorous in the glass layer 130.

The above steps result in the introduction of carbon into the glass layer from the use of the organometallic dopants. The carbon level at the interface between the oxide film and active area silicon interface appears to be directly correlated to the amount of fixed charge in the film. By increasing the film deposition temperature higher than approximately 480 degrees C., the carbon level in the film appears to be scavenged by the $O_3$, leading to a lower fixed charge.

Figure 2:
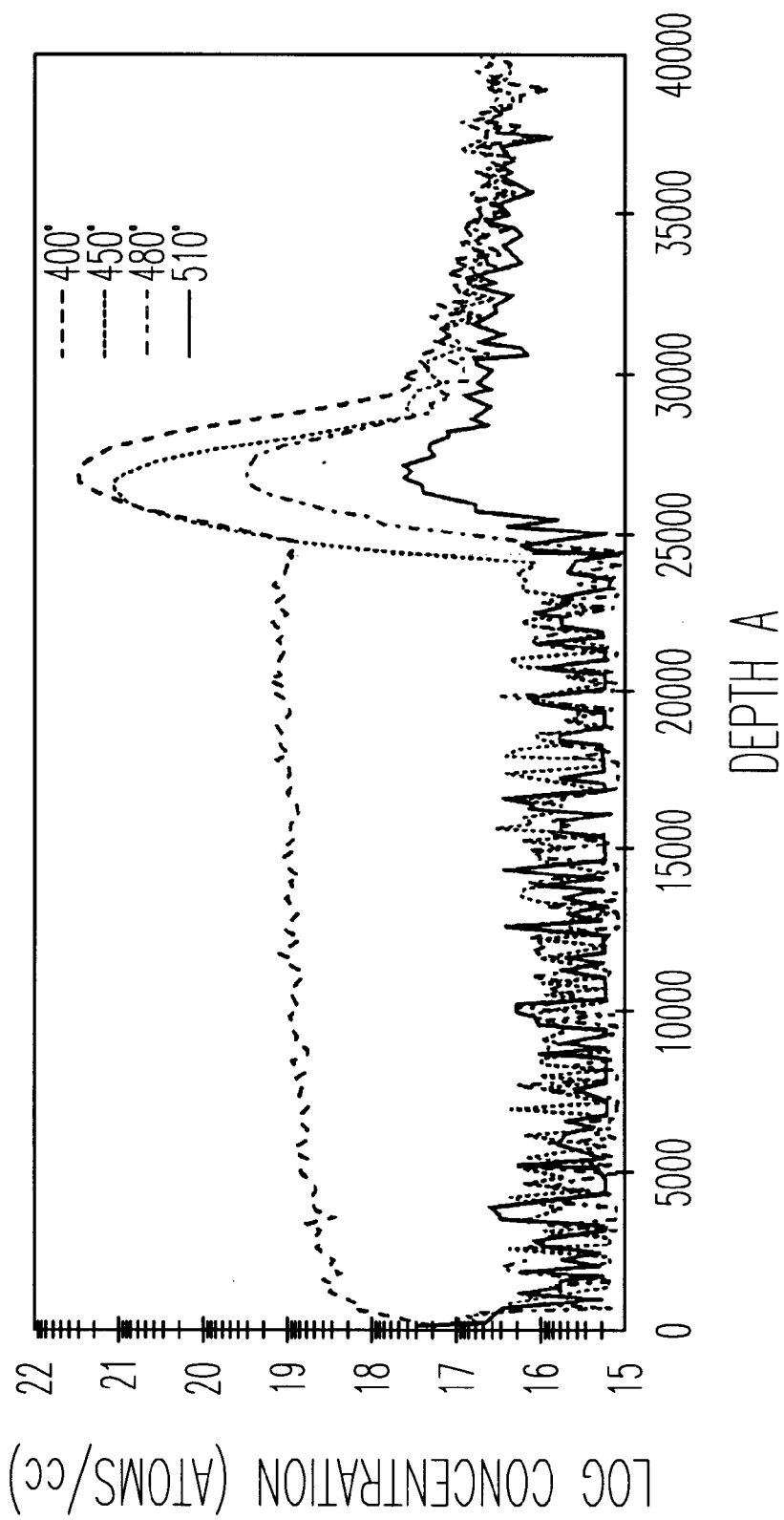
FIG. 2 is a graph of the concentration of carbon versus depth for depositions performed at multiple temperatures.

FIG. 2 is a graph of the carbon level concentrations in atoms per cubic centimeter at various depths in Angstroms of each oxide layer deposited using the present invention. Oxide layers were formed at various identified oxide deposition temperatures. The oxide layers were also reflowed for 30 minutes at 907 degrees C. The measurements were taken at various depths using standard secondary ion mass spectroscopy (SIMS).

The reflow of the layer causes the carbon to migrate toward the interface between the silicon and the oxide layer at about 26,000 Angstrom. The data presented in the graph of actual typical experimental results, shows the carbon has migrated to depths near the interface. The total concentration of carbon is seen to be significantly reduced when the film is deposited in the presence of $O_3$ at temperatures of approximately 480 degrees C. and above. When deposited at 510 degrees C., the concentration of carbon is fewer than about $10^{18}$ to $10^{17}$ atoms per cubic centimeter at its highest concentration and the fixed charge density is less than approximately $5 \times 10^{10}$ per square centimeter.

Figure 3:
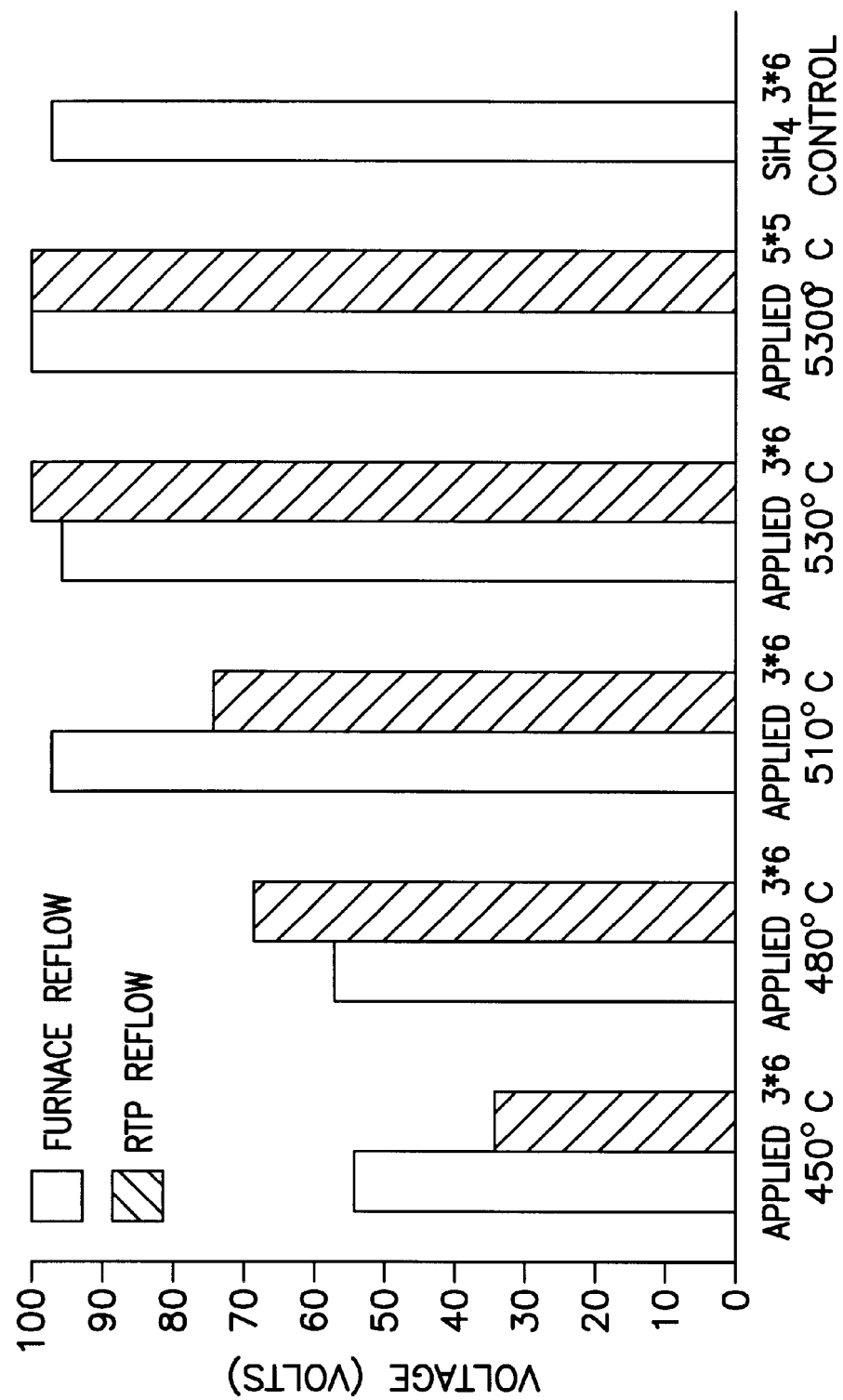
FIG. 3 is a graph of the threshold voltage of a device having insulating layer depositions performed at multiple temperatures.

By reducing the carbon level in the film, a low fixed charge film of oxide is provided. In essence, a higher metal field threshold voltage is obtained for n-channel devices as indicated in FIG. 3. FIG. 3 is a graph of threshold voltage for 24,000 angstrom thick BPSG fields applied in an $O_3$ environment in a deposition chamber at the same temperatures as in FIG. 2. In addition, both a batch furnace reflow for 30 minutes at 907 degrees C. and a rapid thermal process (RTP) reflow for 20 seconds at 1000 degree C. were performed in $N_2$ prior to the threshold voltages being measured. As indicated, the threshold voltage increased dramatically when the film was applied in the presence of $O_3$ at temperatures above approximately 510 degrees C. Improvement was also noted at temperatures above approximately 480 degrees C. It should be noted that the first three layers in FIG. 3 were formed with 3% boron ($B_2O_3$) and 6% phosphorous ($P_2O_5$). At 530 degrees C., the percentages of boron and phosphorous were both 5%. An inorganic control group silane ($SiH_4$) is also shown.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A semiconductor device, comprising:
   a semiconductor substrate having a number of active areas; and
   a borophosphosilicate glass (BPSG) film having an interface with the number of active areas, wherein:
   the BPSG film has a carbon concentration that varies in the BPSG film; and
   a highest concentration of carbon atoms in the BPSG film is near the interface, and is fewer than 1018 carbon atoms per cubic centimeter.

2. The device of claim 1, a fixed charge density in the BPSG film near the interface is less than 5×1010 per square centimeter.

3. The device of claim 1, wherein the BPSG film includes between 0.5% and 6% boron by weight.

4. The device of claim 1, wherein the BPSG film includes between 0.5% and 8% phosphorous by weight.

5. The device of claim 1, wherein the BPSG film includes between 0.5% and 6% boron by weight and between 0.5% and 8% phosphorous by weight.

6. A semiconductor device, comprising:
a semiconductor substrate having a number of active areas; and
a borophosphosilicate glass (BPSG) film having an interface with the number of active areas, the BPSG film being doped with between 0.5% and 6% boron by weight and between 0.5% and 8% phosphorous by weight, wherein:
the BPSG film has a carbon concentration that varies in the BPSG film; and
a highest concentration of carbon atoms in the BPSG film is near the interface, and is fewer than 1018 carbon atoms per cubic centimeter.

7. The device of claim 6, wherein a fixed charge density in the BPSG film near the interface is less than 5×1010 per square centimeter.

8. A semiconductor device, comprising:
a semiconductor substrate having a number of active areas; and
a borophosphosilicate glass (BPSG) film having an interface with the number of active areas, wherein a fixed charge density in the BPSG film near the interface is less than 5×1010 per square centimeter.

9. The device of claim 8, wherein the BPSG film has a carbon concentration that varies in the BPSG film, and a highest concentration of carbon atoms in the BPSG film is near the interface and is fewer than 1018 carbon atoms per cubic centimeter.

10. The device of claim 8, wherein the semiconductor device includes an n-channel device, the BPSG film is approximately 26,000 Å, and a metal field threshold voltage for the n-channel device is over 60 volts.

11. The device of claim 8, wherein the semiconductor device includes an n-channel device, the BPSG film is approximately 26,000 Å, and a metal field threshold voltage for the n-channel device is over 80 volts.

12. A semiconductor device, comprising:
a semiconductor substrate having a number of active areas; and
a borophosphosilicate glass (BPSG) film having an interface with the number of active areas, the BPSG film being doped with between 0.5% and 6% boron by weight and between 0.5% and 8% phosphorous by weight, wherein a fixed charge density in the BPSG film near the interface is less than 5×1010 per square centimeter.

13. The device of claim 12, wherein the BPSG film has a carbon concentration that varies in the BPSG film, a highest concentration of carbon atoms in the BPSG film is near the interface and is fewer than 1018 carbon atoms per cubic centimeter.

14. The device of claim 12, wherein the semiconductor device includes an n-channel device, the BPSG film is approximately 26,000 Å, and a metal field threshold voltage for the n-channel device is over 60 volts.

15. The device of claim 12, wherein the semiconductor device includes an n-channel device, the BPSG film is approximately 26,000 Å, and a metal field threshold voltage for the n-channel device is over 80 volts.

16. A semiconductor device, comprising:
a semiconductor substrate having a number of active areas; and
a borophosphosilicate glass (BPSG) film having an interface with the number of active areas, wherein:
the BPSG film has a carbon concentration that varies in the BPSG film;
a highest concentration of carbon atoms in the BPSG film is near the interface, and is fewer than 1018 carbon atoms per cubic centimeter; and
a fixed charge density in the BPSG film near the interface is less than 5×1010 per square centimeter.

17. The device of claim 16, wherein the BPSG film includes 3% boron.

18. The device of claim 16, wherein the BPSG film includes 5% boron.

19. The device of claim 16, wherein the BPSG film includes 3% phosphorous.

20. The device of claim 16, wherein the BPSG film includes 5% phosphorous.

21. The device of claim 16, wherein the BPSG film includes between 0.5% and 6% boron by weight and between 0.5% and 8% phosphorous by weight.

22. A semiconductor device, comprising:
a semiconductor substrate having a number of active areas; and a borophosphosilicate glass (BPSG) film having an interface with the number of active areas, the BPSG film being doped with phosphorous and boron to provide the BPSG film with a capability to reflow and fill tight spaces at low temperatures, wherein:
the BPSG film has a carbon concentration gradient in which a highest concentration of carbon atoms in the BPSG film is near the interface;
the highest concentration of carbon atoms in the BPSG film is fewer than 1018 carbon atoms per cubic centimeter; and
a fixed charge density in the BPSG film near the interface is less than 5×1010 per square centimeter.

23. The device of claim 22, wherein the BPSG film includes between 0.5% and 6% boron by weight.

24. The device of claim 22, wherein the BPSG film includes between 0.5% and 8% phosphorous by weight.

25. The device of claim 22 wherein the BPSG film includes between 0.5% and 6% boron by weight and between 0.5% and 8% phosphorous by weight.

26. The device of claim 22, wherein the BPSG film includes 3% boron and 6% phosphorous.

27. The device of claim 22, wherein the BPSG film includes 5% boron and 5% phosphorous.

28. A semiconductor device, comprising:
a substrate;
a plurality of transistor active areas formed in the substrate;
at least one field oxide region disposed between at least two of the active areas; and
a borophosphosilicate glass (BPSG) film formed over the substrate and having an interface with at least some of the plurality of transistor active areas, the BPSG film including organometallic precursors such that the BPSG film includes boron and phosphorous, wherein the BPSG film has a carbon concentration that varies in the BPSG film, and a highest concentration of carbon atoms in the BPSG film is near the interface and is fewer than $10^{18}$ carbon atoms per cubic centimeter.

29. The device of claim 28, a fixed charge density in the BPSG film near the interface is less than $5 \times 10^{10}$ per square centimeter.

30. The device of claim 28, wherein the BPSG film includes between 0.5% and 6% boron by weight.

31. The device of claim 28, wherein the BPSG film includes between 0.5% and 8% phosphorous by weight.

32. The device of claim 28, wherein the BPSG film includes between 0.5% and 6% boron by weight and between 0.5% and 8% phosphorous by weight.

33. The device of claim 28, wherein the organometallic precursors include triethylborane (TEB) and triethylphosphate (TEPO).

* * * * *